United States Patent [19]

Kamimaru

[11] Patent Number: 4,545,063

[45] Date of Patent: Oct. 1, 1985

[54] PROGRAMMABLE COUNTER SYSTEM

[75] Inventor: Nobuyuki Kamimaru, Yokohama, Japan

[73] Assignee: Tokyo Shibaura Denki Kabushiki Kaisha, Kawasaki, Japan

[21] Appl. No.: 497,136

[22] Filed: May 23, 1983

[30] Foreign Application Priority Data

May 31, 1982 [JP] Japan .................................. 57-92903

[51] Int. Cl.$^4$ ............................................ H03K 21/36
[52] U.S. Cl. ...................................... 377/52; 377/33; 377/44; 377/48
[58] Field of Search ....................... 377/33, 52, 44, 47, 377/48

[56] References Cited

U.S. PATENT DOCUMENTS

| | | | |
|---|---|---|---|
| 3,976,946 | 8/1976 | Schroder | 377/52 |
| 4,084,082 | 4/1978 | Alfke | 377/52 |
| 4,184,068 | 1/1980 | Washburn | 377/52 |
| 4,468,797 | 8/1984 | Shin | 377/52 |

OTHER PUBLICATIONS

Suzuki et al., "Electronic Science", Jul. issue 1978, pp. 69–80.

Primary Examiner—John S. Heyman
Attorney, Agent, or Firm—Finnegan, Henderson, Farabow, Garrett & Dunner

[57] ABSTRACT

A programmable counter system of the swallow operation type using binary counters is disclosed. The counter comprises a prescaler for frequency dividing an input signal by a frequency division factor "$2^n-1$" or "$2^n$", upper and lower order bit counters for counting down an output signal from the prescaler, a flip-flop for selecting either the frequency division factor "$2^n-1$" or "$2^n$" according to the logical level of the output signal of the counter A or B, and inverters for level inverting programming data and applying them to the lower order bit counter A, thereby setting a division number of the counter A to a complement of the binary code of the programming data.

6 Claims, 103 Drawing Figures

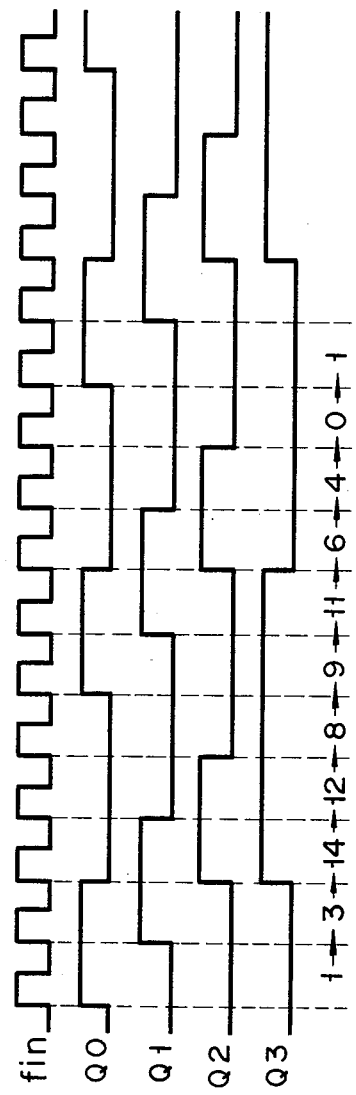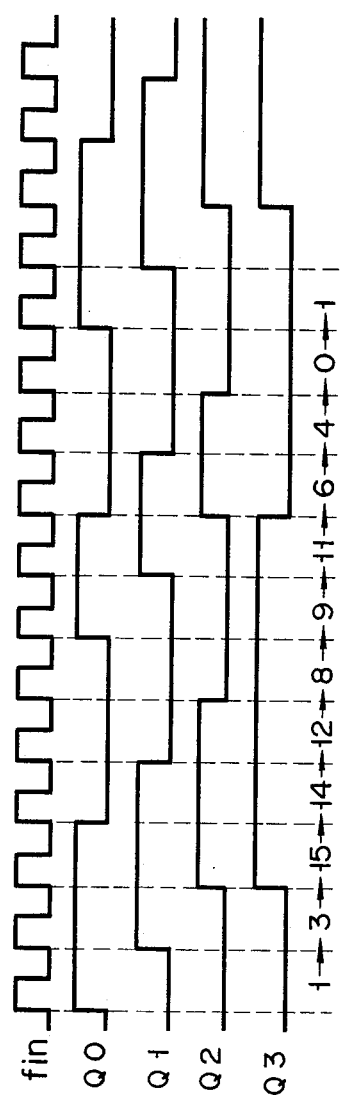

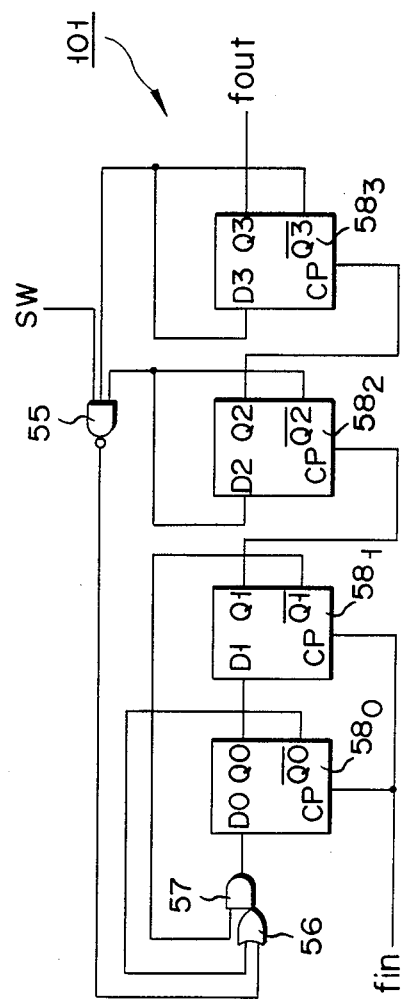
F I G. 15

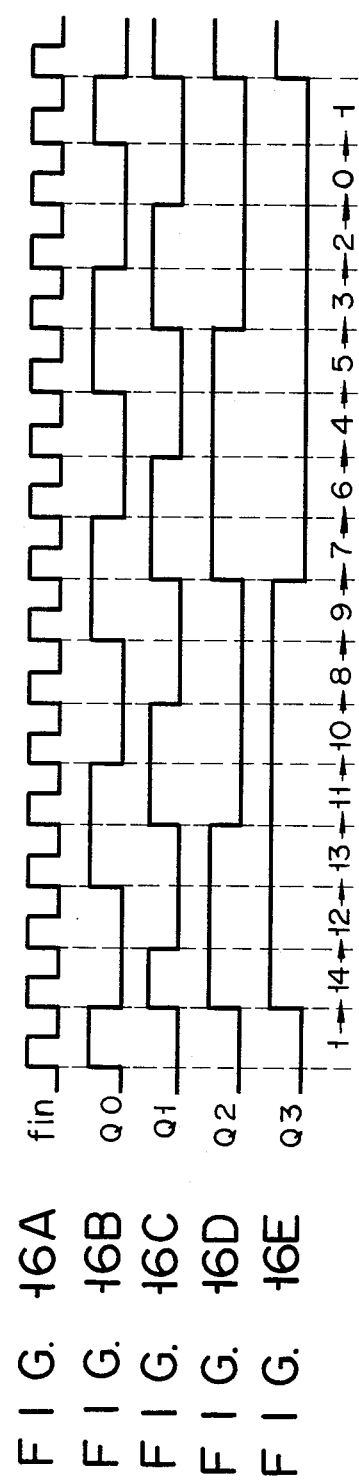
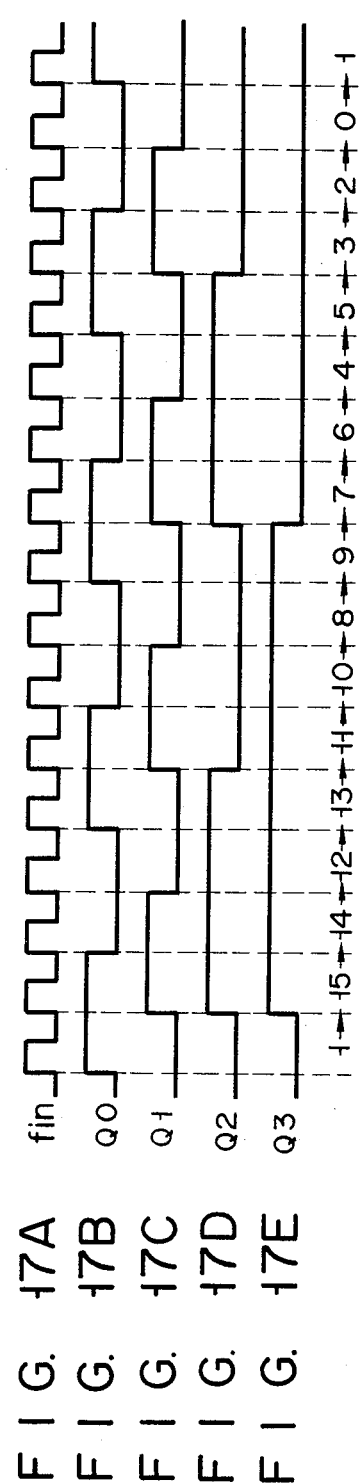

PROGRAMMABLE COUNTER SYSTEM

BACKGROUND OF THE INVENTION

The present invention relates to a programmable counter system of the swallow operation type.

A configuration of a programmable counter system of the swallow operation type is illustrated in FIG. 1. A frequency division factor of a prescaler 1 is set at "M+1" or "M" according to the logic level "1" or "0" of a frequency division factor select signal SW. A pulse input fin at the input is frequency-divided by the frequency division factor "M+1" or "M". In this instance, for simplicity, a pulse output fout from the prescaler 1 is supplied to two programmable downcounters A and B. In this specification, symbols denoting signals, for example, fin and fout, will also be used to designate their frequencies. An output Pout1 of the counter A and an output Pout2 of the counter B are applied to a flip-flop 2, which serves as a control circuit for a frequency division factor select signal SW. The output signals then invert the logical level of the flip-flop 2. The output signal of the flip-flop 2 is applied as the select signal SW to the prescaler 1.

Assume now that the select signal SW is logical "1" and the frequency division factor of the prescaler 1 is "M+1". In this condition, the prescaler 1 frequency-divides the input signal fin by the frequency division factor "M+1" to produce an output signal fout at a frequency fin/(M+1). The output signal fout is input to the counters A and B. Values N1 and N2 (N2 being larger than N1) have been previously set in the counters A and B, respectively. The counters A and B count down the output signal fout. Since N1 is smaller than N2, as mentioned above, the counter A completes the counting operation earlier than the counter B. When the output signal Pout1 of the counter A is logical "1", the output signal of the flip-flop 2 is inverted in logical level, so that the select signal SW applied to the prescaler 1 is switched from logical "1" to logical "0". When the select signal SW is switched to logical "0", the frequency division factor is switched from "M+1" to "M". Therefore, the output signal fout from the prescaler 1 has a frequency fin/M. The counter B counts down the output signal fout (=fin/M). The counter B had already completed the frequency division of "N1". Therefore, when the counter B completes the frequency division of "N2−N1", the output signal Pout2 of the counter B is logical "1". The output signal Pout2 is input as a preset signal to the counters A and B, and also to the flip-flop 2. In response to this preset signal, the preset values N1 and N2 are set in the counters A and B, and the select signal SW is logical "1", and the frequency division factor "M+1" is set in the prescaler 1. Thus, the programmable counter system returns to the original or initial state. Subsequently, an operation similar to the above is repeated.

In the above operation, a division number N, which is a reciprocal of a frequency division factor of an overall programmable counter system shown in FIG. 1, i.e., a ratio of the frequency fin of the input signal to that, $f_{preset}$, of the preset signal, is given as:

$$N = (M+1)N1 + M(N2 - N1) \quad (1)$$
$$= MN2 + N1$$

In equation (1), when M=10, $$N = 10N2 + N1.$$

Note here that if the first place of numerals in BCD (binary coded decimals) is allotted to N1 and the second and subsequent places of the numerals to N2, the circuit of FIG. 1 serves as a BCD programmable counter system. Further, since the counter of FIG. 1 is of the swallow operation type, it is sufficient that the counters A and B merely count the output signal at the frequency fin/M+1 of fout/M. Therefore, high speed operation is not required for this counter system.

A counting example where N=259, M=10, N1=9 and N2=25, will now be described.

FIG. 2 illustrates a practical arrangement of a prescaler which performs the frequency division of the input signal fin at a frequency division factor 10 (=M) when SW=logical "0", and at 11 (=M+1) when SW=logical "1". As shown, the prescaler 1 comprises dynamic type flip-flop $11_0$ to $11_3$, inverters 12 and 13, an OR circuit 14, an AND circuit 15, and a NOR circuit 16. FIGS. 3A to 3E and FIGS. 4A to 4E illustrate waveforms at the various portions when the select signal SW is "0" and "1", respectively. More specifically, FIG. 3A illustrates a waveform of the input signal fin, and FIGS. 3B to 3E show waveforms of the output signals Q0 to Q3 of the flip-flop $11_0$ to $11_2$. Similarly, FIG. 4A shows a waveform of the input signal fin, and FIGS. 4B to 4E show waveforms of the output signals Q0 to Q3 of the flip-flop $11_0$ to $11_3$. As seen from FIGS. 3A to 3E, when the select signal SW is logical "0", the input frequency fin is divided by a factor of ten through a decimal change 1→3→14→12→8→9→11→6→4→0. Similarly, as seen from FIGS. 4A to 4E, when SW="1", the input frequency fin is divided by a factor of eleven through a decimal change of 1→3→15→14→12→8→9→11→6→4→0.

FIGS. 5 shows a practical arrangement of the combination of the counters A and B or a counter section. The counter A is composed of flip-flop $21_0$ to $21_3$ of the dynamic type and inverters 22 and 23, and AND gates 24, 25 and 26. The counter B is composed of flip-flops $21_4$ to $21_{11}$ of the dynamic type, inverters 27 and 28, and AND gates 29 to 34. Assume now that 259 is set in these counters A and B in BCD form. A decimal number "9" is set as N1 in the counter A in BCD form. That is, preset data PD0="1", PD1="0", PD2="0" and PD3="1" are combined to represent a decimal number 9 and are set in the flip-flops $21_0$ to $21_3$, respectively. Numerals 2 and 5 in the second and third places of the number 259 are preset as N2 in the counter B. To this end, preset data PD4="1", PD5="0", PD6="1", and PD7="0", which together denote a decimal number 5, are set in the flip-flops $21_4$ to $21_7$, respectively. Preset data PD8="0", PD9="1", PD10="0" and PD11="0", which together denote a decimal number 2, are set into the flip-flops $21_8$ to $21_{11}$, respectively. In the same way, N2=25 is set in the counter B in BCD.

FIGS. 6A to 6Q are timing charts of waveforms at various portions in the circuit of FIG. 5. The character 60 is not used to avoid confusion with the number 60. FIG. 6A shows a waveform of an input signal CPin input to the counters A and B, i.e., the output signal fout of the prescaler 1 in FIG. 1. FIGS. 6B to 6E show output signals Q0 to Q3 of the flip-flops $21_0$ to $21_3$ in the counter A. FIG. 6F is a waveform of an output signal from the counter A. FIGS. 6G to 6N are waveforms of the output signals $\overline{Q4}$ to $\overline{Q11}$ of the flip-flops $21_4$ to $21_{11}$, respectively. FIGS. 6P is a waveform of an output signal f$_{preset}$ of the counter B, and FIG. 6Q is a waveform of a flip-flop 2 as a select signal control circuit. As seen from FIGS. 6A to 6Q, an output signal at a frequency fin/259 is obtained by counting the factor-of-11 output signal from the prescaler 1 nine times and counting the factor-of-10 output signal from the same sixteen times (16=25−9).

The example shown in FIG. 5 uses decimal operation type counters. Another example using binary operation type counters will be described referring to FIG. 7. In this example, the 4-bit type counter A is composed of four dynamic type flip-flops with preset functions 41$_0$ to 41$_3$, an inverter 42, and AND gates 43 to 45. The 6-bit type counter B is composed of six dynamic counters with preset functions 41$_4$ to 41$_9$, and AND gates 46 to 50. When the counters A and B are of the binary operation type, the prescaler used has a frequency division factor selectable from "$2^n+1$" and "$2^n$" (where n is the number of bits of the counter A). In the example shown in FIG. 7, the counter A must be of the type in which the frequency division factor is selectable from $(2^4+1) = 17$ and $2^4 = 16$. In the counter A, N1 as the preset value (division number) of the lower order is programmed in BCD form. N2 as the preset value (division number) of the higher order is programmed in the counter B. When the counters A and B are thus programmed, the programming counter system in FIG. 7 contains the following frequency division number preset:

$$N = 17N1 + 16(N2 - N1) \quad (2)$$
$$= 16N2 + N1$$

When N1=7 and N2=30, N2=30, N=16×30+7 =487. For programming N1=7 in the counter A, programming data PD0="1", PD1="1", PD2="1", PD3="0" are set in the flip-flops 41$_0$ to 41$_3$. For programming N2=30 in the counter B, programming data PD4="0", PD5="1", PD6="1", PD7="1", PD8="1" and PD9="0" are set in the flip-flops 41$_4$ to 41$_9$, respectively.

FIGS. 8A to 8M are waveforms of signals at various portions in the counter circuit shown in FIG. 7. FIG. 8A shows a waveform of an input signal PCin applied to the counters A and B shown in FIG. 1. FIGS. 8B to 8E show waveforms of output signals $\overline{Q0}$ to $\overline{Q3}$ from the flip-flops 41$_0$ to 41$_3$, respectively. FIG. 8F shows a waveform of an output signal from the counter A. FIGS. 8G to 8L are waveforms of output signals $\overline{Q4}$ to $\overline{Q9}$ of the flip-flops 41$_4$ to 41$_9$ of the counter B, respectively. FIG. 8M is a waveform of an output signal preset of the counter B. FIG. 8N shows a waveform of an output signal SW of the flip-flop 2 constituting a select signal control circuit. As seen from FIGS. 8A to 8N, $$N = 17 \times 7 + 16 \times 23$$
$$= 487$$

The result is equal to the value obtained by the equation (2).

As described above, when a programmable counter system of swallow operation type uses binary counters, a prescaler must have a frequency division factor selectable from $2^n+1$ and $2^n$ for the counter A of n bit length in which the lower order bit of the frequency division factor are preset. The prescaler must be one bit larger than the counter A which stores the lower order bits. The prescaler is a circuit operating at high speed, and hence its power dissipation per bit is large. Further, the increased number of bits in the prescaler is accompanied by an increase in the number of control circuits, resulting in damage to the control circuit. Therefore, it is necessary to limit the number of bits in the prescaler.

SUMMARY OF THE INVENTION

Accordingly, an object of the present invention is to provide a programmable counter system of the swallow operation type using binary counters, in which the number of bits required for the prescaler is reduced, with less power dissipation and increased operation speed. According to the invention, there is provided a programmable counter system comprising: a prescaler for frequency dividing an input signal by a frequency division factor of "$2^n-1$" or "$2^n$"; counter means for counting an output signal of said prescaler, said counter means including a lower order bit counter and a higher order bit counter; means for selecting one of said frequency division factors "$2^n-1$" and "$2^n$"; and means for setting a division number of said lower order bit counter to a complement of a binary code of a programming signal.

BRIEF DESCRIPTION OF THE DRAWINGS

FIGS. 3A to 3E and 4A to 4E show waveforms of various portions of the prescaler of FIG. 2 when a frequency division factor select signal input thereto is logical "0" and "1", respectively;

FIG. 15 shows a circuit diagram of a prescaler used in the embodiments shown in FIGS. 9 to 13;

FIGS. 16A to 16E show signal time charts of signals at various portions in the prescaler when a frequency division factor is logical "0"; and FIGS. 17A to 17E show signal time charts of the same when the select signal is logical "1".

DETAILED DESCRIPTION OF THE PREFERRED EMBODIMENTS

Figure 1:
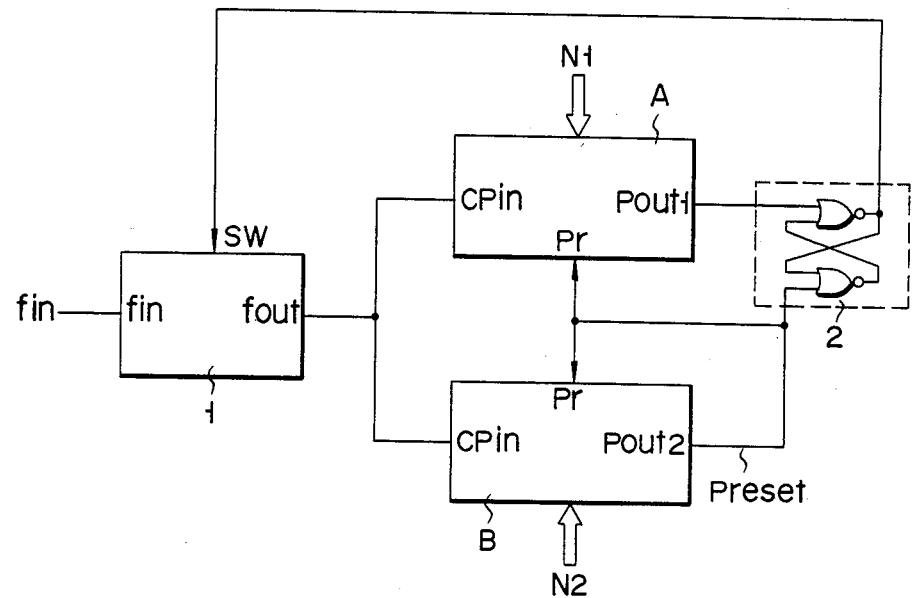
FIG. 1 shows a block diagram of a conventional programmable counter system of the swallow operation type.
Figure 2:
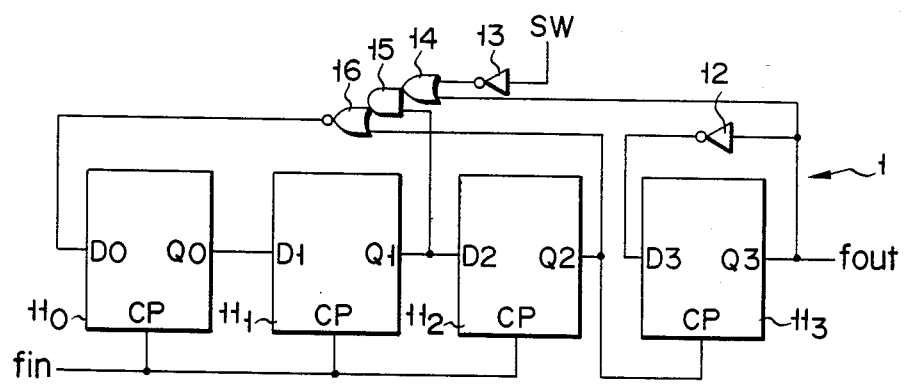
FIG. 2 shows a circuit diagram of a prescaler used in the programmable counter system shown in FIG. 1.
Figure 5:
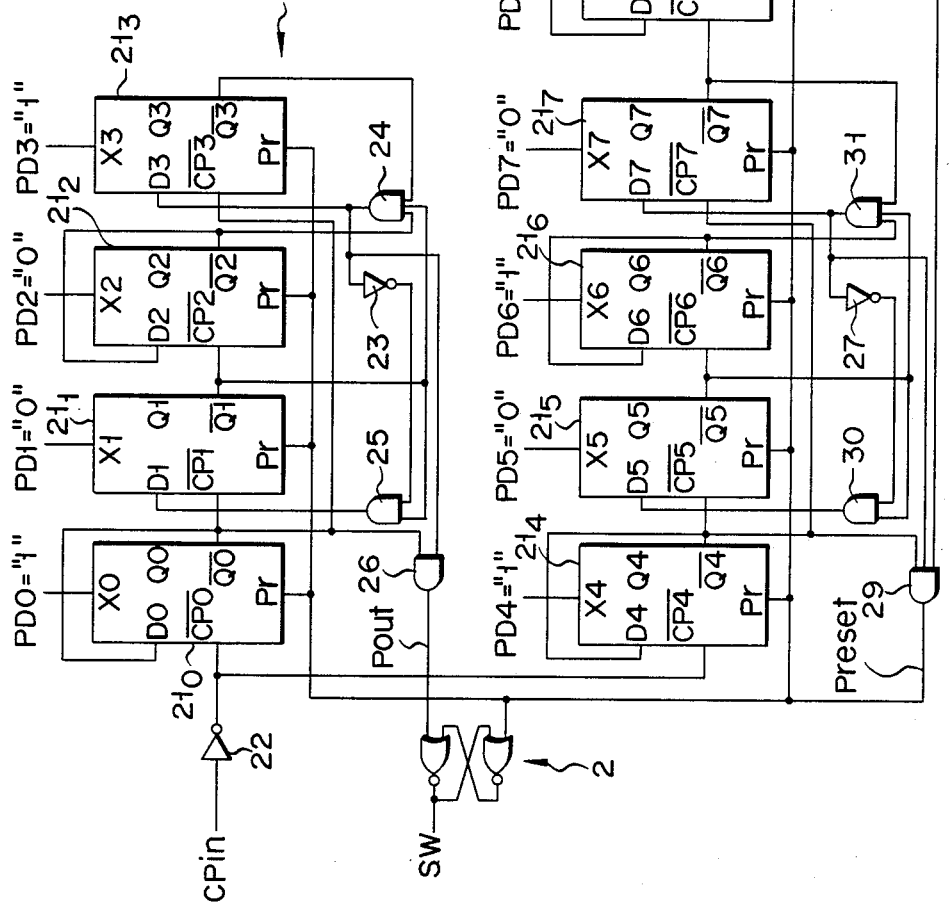
FIG. 5 shows a circuit diagram of a counter section in the counter system of FIG. 1.
Figure 6:
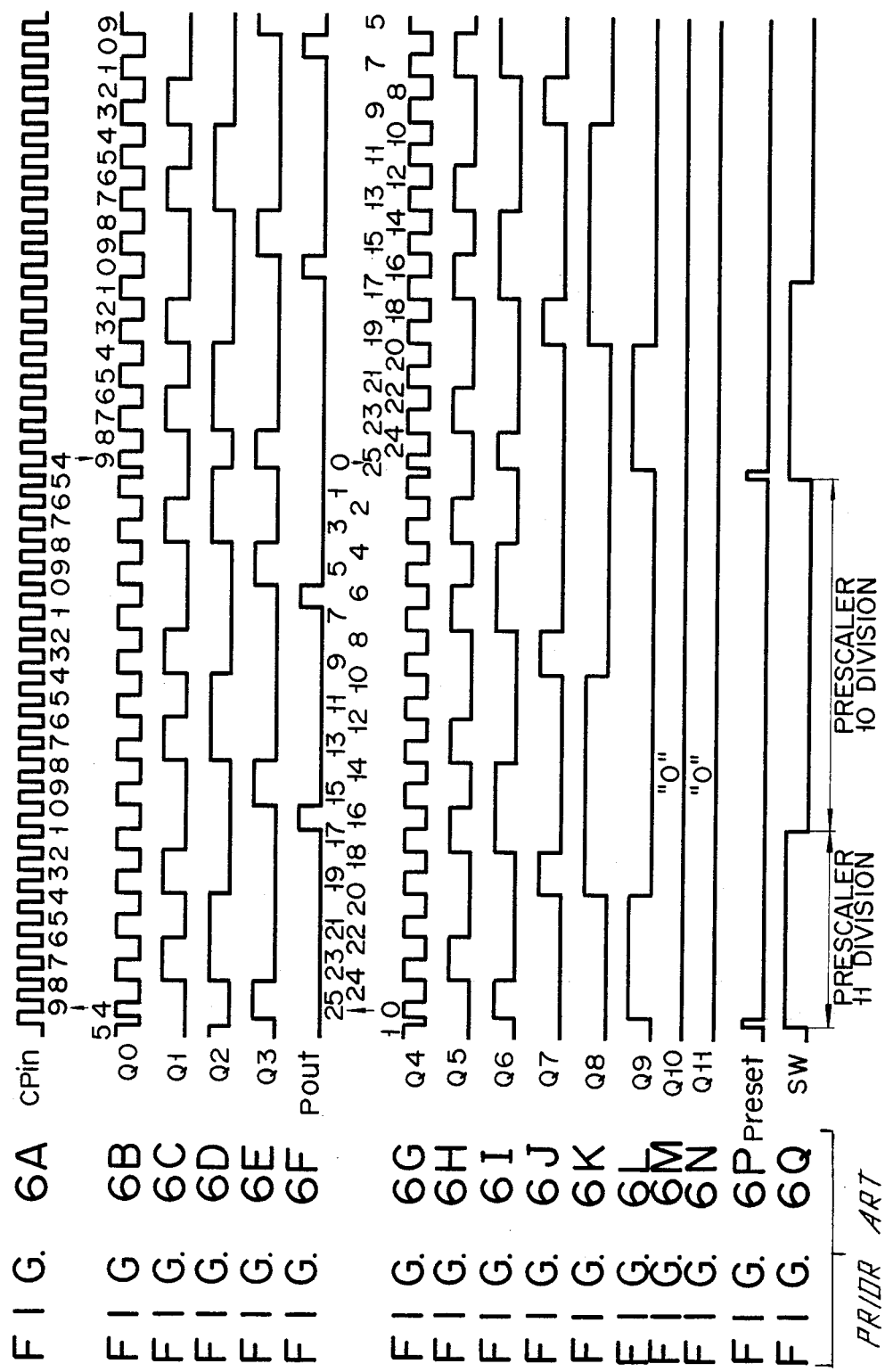
FIGS. 6A to 6Q are timing diagrams of signals at various portions in FIG. 5, the character 60 not being used in order to avoid confusion with the number 60.
Figure 7:
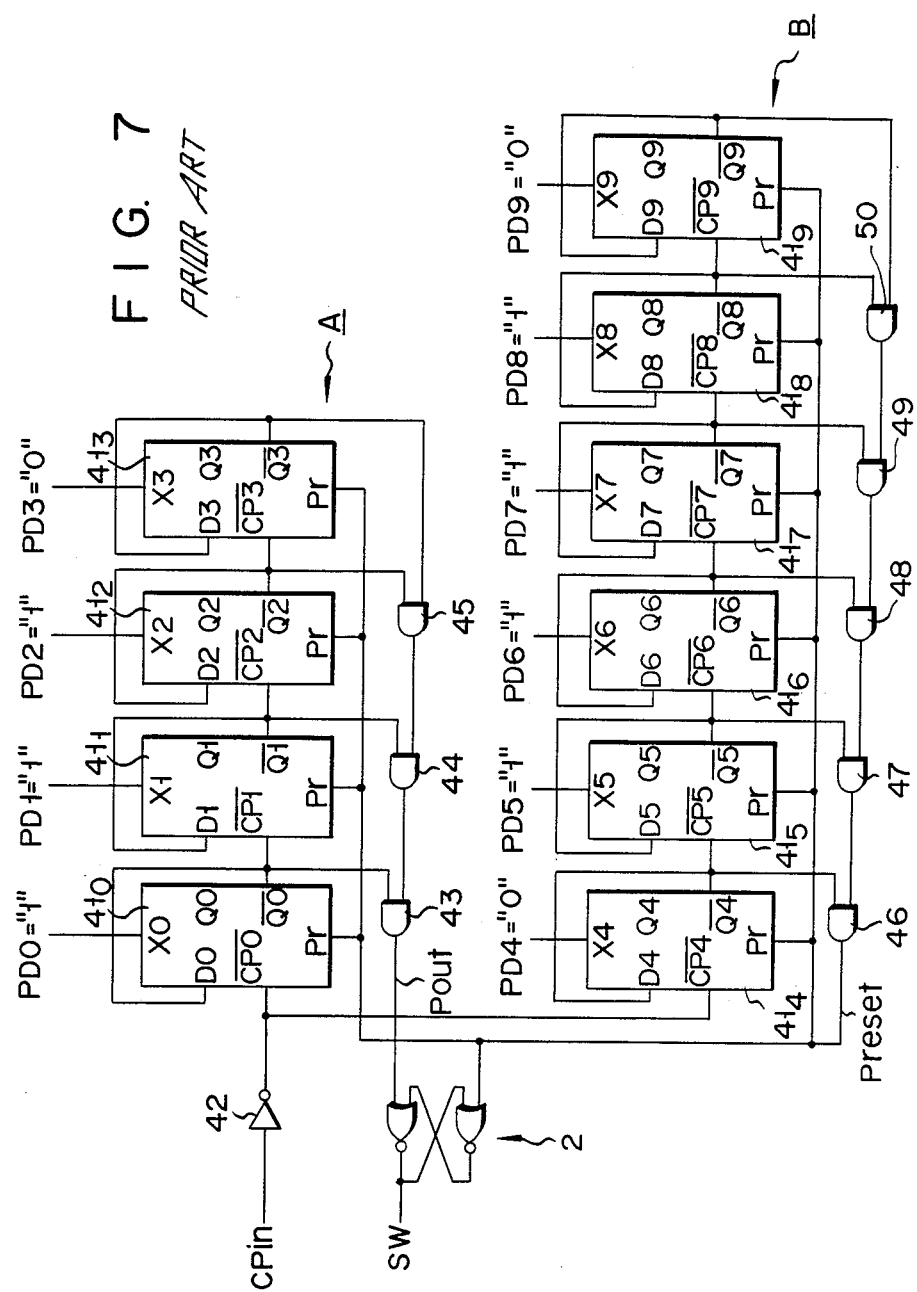
FIG. 7 is a circuit diagram of another example of the counter section in the counter system shown in FIG. 1.
Figure 8:
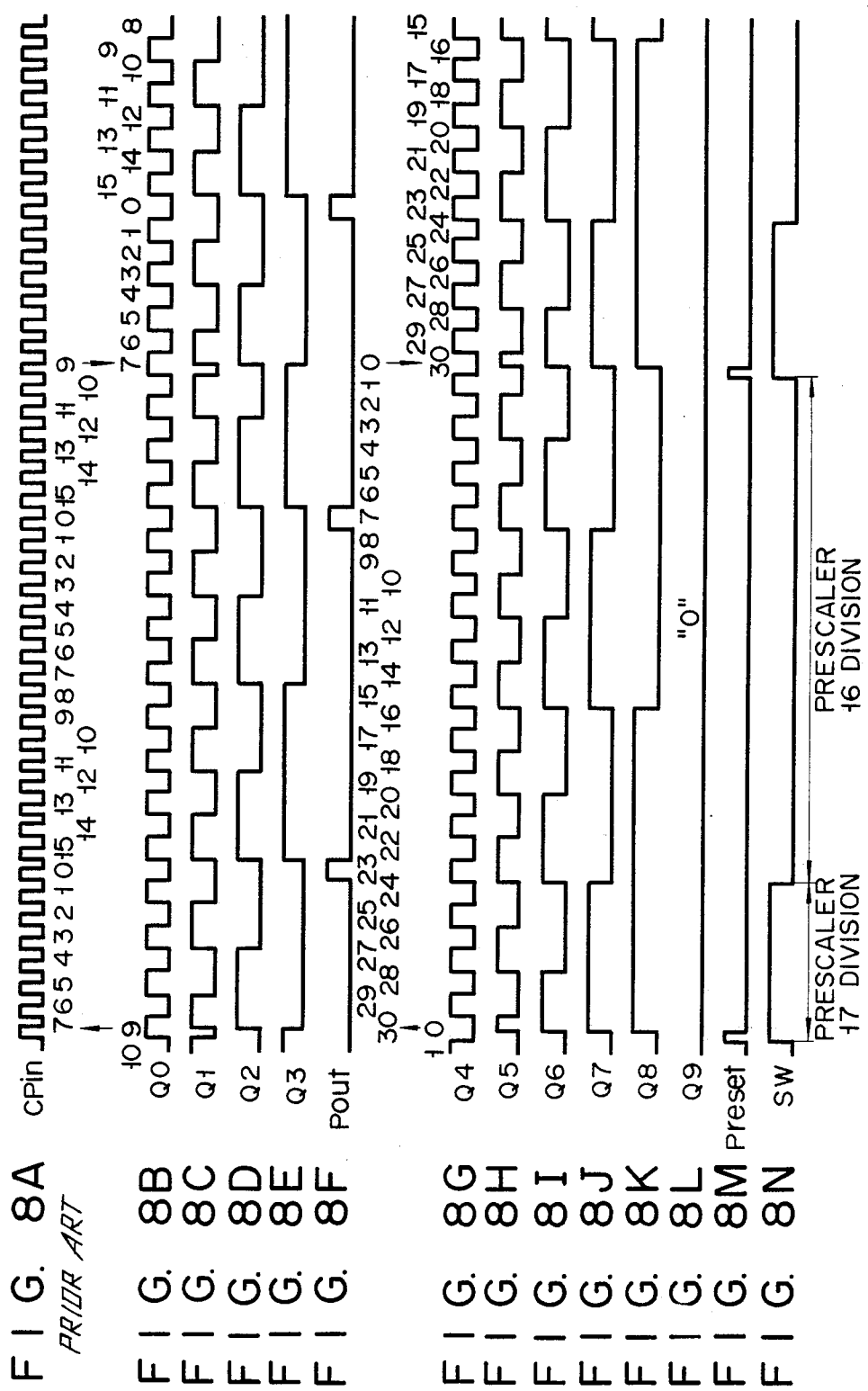
FIGS. 8A to 8N show timing diagrams of signals at various portions in the counter section of FIG. 7.

An embodiment of a programmable counter system of the binary type according to the present invention will be described with reference to FIG. 9.

A prescaler 101 contained in the programmable counter system is designed such that the frequency division factor is selected to be "$2^n-1$" for logical "1" of a frequency division factor select signal SW, and to be "$2^n$" of logical "0" of the select signal SW. The n in the expression of the frequency division factor indicates the number of bits of the lower order bit counter A. When the frequency division factor of the prescaler 101 is selected to be "$2^n-1$", the prescaler 101 frequency-divides the input signal fin by a frequency division factor of "$2^n-1$". Similarly, when it is selected to be "$2^n$", the prescaler 101 frequency-divides the input signal fin by "$2^n$". The prescaler 101 is connected at the output terminal to the lower order bit counter A and the higher order bit counter B, through an inverter 42. The counter A having 4 bits is composed of flip-flops $41_0$ to $41_3$ and AND gates with two-input type 43 to 45. The counter B having 6 bits is composed of six flip-flops $41_4$ to $41_9$ and five two-input type AND gates 46 to 50. The output terminals of the counters A and B are both connected to a control circuit 2 containing a flip-flop for the select signal control. Inverters $51_0$ to $51_3$ are for inverting preset data PD0 to PD3 applied to the counter A. As will be described later, these inverters are used for forming complements of these programming data. The control circuit 2 responds to the output signal from the counter A or B to produce a select signal of logical "1" or logical "0". Of the flip-flops $41_0$ to $41_3$, the flip-flop $41_0$ provides the least significant bit and the flip-flop $41_3$ provides the most significant bit. Similarly, of the flip-flops $41_4$ to $41_9$, the flip-flop $41_4$ provides the least significant bit and the flip-flop $41_9$ the most significant bit. In the counter A, an output signal fout or CPin of the prescaler 101 is applied through the inverter 42 to the input terminal $\overline{CP0}$ of the flip-flop $41_0$. The output terminals $\overline{Q0}$ to $\overline{Q2}$ of the flip-flops $41_0$ to $41_2$ are respectively connected to the input terminals $\overline{CP1}$ to $\overline{CP3}$ of the succeeding stage flip-flops $41_1$ to $41_3$. The D terminals D0 to D3 of the flip-flops $41_0$ to $41_3$ are respectively connected to the output terminals thereof, $\overline{Q0}$ to $\overline{Q3}$. The output terminal $\overline{Q2}$ of the flip-flop $41_2$ is connected to one of the input terminals of the AND gate 45 whose other input terminal is connected to the output terminal of the flip-flop $41_3$. The output terminal $\overline{Q1}$ of the flip-flop $41_1$ is connected to one of the input terminals of the AND gate 44 whose other input terminal is connected to the output terminal of the AND gate 45. The output terminal $\overline{Q0}$ of the flip-flop $41_0$ is connected to one of the input terminals of the AND gate 43 whose other input terminal is connected to the output terminal of the AND gate 44. The output terminal of the AND gate 43 is connected to one of the input terminals of the flip-flop 2. Also in the counter B, the output signal fout or CPin from the prescaler 101 is input through the inverter 42 to the input terminal $\overline{CP4}$ of the flip-flop $41_4$. The output terminals $\overline{Q4}$ to $\overline{Q8}$ of the flip-flops $41_4$ to $41_8$ are respectively connected to the input terminals $\overline{CP5}$ to $\overline{CP9}$ of the succeeding flip-flops $41_5$ to $41_9$. Further, the D terminals D4 to D9 of the flip-flops $41_4$ to $41_9$ are connected to the output terminals $\overline{Q4}$ to $\overline{Q9}$, respectively. The output terminal $\overline{Q8}$ of the flip-flop $41_8$ is connected to one of the input terminals of the AND gate 50 of which the other input terminal is connected to the output terminal $\overline{Q9}$ of the flip-flop $41_9$. The output terminal $\overline{Q7}$ of the flip-flop $41_7$ is connected to one of the input terminals of the AND gate 49 of which the other input terminal is connected to the output terminal of the AND gate 50. The output terminal $\overline{Q6}$ of the flip-flop $41_6$ is connected to one of the input terminals of the AND gate 48 whose other input terminal is connected to the output terminal of the AND gate 49. The output terminal $\overline{Q5}$ of the flip-flop $41_5$ is connected to one of the input terminals of the AND gate 47 whose other input terminal is connected to the output terminal of the AND gate 48. The output terminal $\overline{Q4}$ of the flip-flop $41_4$ is connected to one of the input terminals of the AND gate 46 which is also connected at the other input terminal to the output terminal of the AND gate 47. Preset terminals Pr of all the flip-flops $41_0$ to $41_3$ in the counter A and all the flip-flops $41_4$ to $41_9$ in the counter B are commonly connected to one another. The programming terminals X0 to X3 of the flip-flops $41_0$ to $41_3$ in the counter A are respectively connected to the output terminals of the inverters $51_0$ to $51_3$. Programming data PD0 to PD3 are input to the inverters $51_0$ to $51_3$, respectively. The inverted programming data PD0 to PD3 are respectively applied to the programming terminals X0 to X3 of the flip-flops $41_0$ to $41_3$. Programming data PD4 to PD9 are directly applied to the programming terminals X4 to X9 of the flip-flops $41_4$ to $41_9$ in the counter B, respectively.

In the programmable counter system thus arranged, the lower order bit counter A has a 4-bit. Accordingly, n=4 and hence, the frequency division factor of the prescaler 101 is 15 or 16. Therefore, a division number N of the overall counter, system is given as:

$$N = 15N1 + 16(N2 - N1) \qquad (3)$$
$$= 16N2 - N1$$

where N1 indicates the lower four bits of a binary code, and N2 indicates the upper bits. In equation (3), when N1 is incremented by 1, / N is decremented by 1. Therefore, the counter system based on the above equation does not function as a programmable counter system. To avoid this problem, "15−NI", not N1 is programmed in the counter A. In this case, the division number N is $$N = 16N2 - (15 - N1) \qquad (4)$$
$$= 16N2 + N1 - 15$$

In equation (4), when N1 is incremented by 1, N also is incremented by 1. In another case, N1=7 and N2=30 and "15−N1" is programmed in the counter A. To program "15−N1" in the counter A, it is sufficient that a BCD code representing a complement of N1 for 15−N1, i.e., "15−7"+8, is set in the counter A. Thus, a complement of (1 1 1 0) representing 7 (=N1), i.e., (0 0 0 1), is set in the counter A. This is logically realized by inverting the (1 1 1 0) and set in the counter A. In this binary notation, (1 1 1 0) is equivalent to $2^0=1$, $2^1=1$, $2^2=1$ and $2^3=0$, and (0 0 0 1) to $2^0=0$, $2^1=0$, $2^2=0$ and $2^3=1$. The bit order in this binary notation is the reverse of that used in ordinary binary notation. This is done in order to make the bit order coincide with that of the counter A in FIG. 9. In this embodiment, in order to input the complement signal of N1 into the counter A, the binary code signals of N1 are input to the flip-flops $41_0$ to $41_3$ via the inverters $51_0$ to $51_3$. If the BCD code (1 1 1 0) representing N1=7 is set as the programming data to the programmable counter system, PD0 =1, PD1=1, PD2=1 and PD3 =0. The preset data PD0 is applied to the programming terminal X0 of the flip-flop $41_0$ via inverter $51_0$. The preset data PD1 =1 is input to the programming terminal X1 of the flip-flop $41_1$ through the inverter $51_1$. The preset data PD2 =1 is input to the programming terminal X2 of the flip-flop $41_2$ via the inverter $51_2$. The preset data PD3 =0 is applied to the programming terminal X3 of the flip-flop $41_3$ via the inverter $51_3$. In this way, when the signals inverted by the inverters $51_0$ to $51_4$ are applied to the flip-flops $41_0$ to $41_3$ in the counter A, a complement (0 0 0 1) (=8) of the programming signal (1 1 1 0) is set in the counter A. The inverters $51_0$ to $51_4$ connected to the counter A form complements of the programming signals and set the complements in the counter A.

As for the higher order bit counter B, if binary code (0 1 1 1 1 0) representing N2 =30 is used as the programming data, PD4 =0, PD5 =1, PD6 =1, PD7 =1, PD8 =1 and PD9 =0.

Such programming data are applied to the programming terminals X4 to X9 of the flip-flops $41_4$ to $41_9$, respectively, and are then programmed in the counter B. FIGS. 10A to 10N are signal time charts useful in explaining the operation of the programmable counter system of FIG. 9. FIG. 10A shows a waveform of the output signal fout or CPin of the prescaler 101. FIGS. 10B to 10E are waveforms $\overline{Q0}$ to $\overline{Q3}$ of the flip-flops $41_0$ to $41_3$ and FIG. 10F a waveform of an output signal Pout of the counter A. FIGS. 10G to 10L are waveforms of the output signals $\overline{Q4}$ to $\overline{Q9}$ of the flip-flops $41_4$ to $41_9$, respectively. FIG. 10M shows a waveform of a preset signal output from the counter B. FIG. 10N shows a waveform of a frequency division factor select signal SW.

Assume now that the preset signal is produced and the select signal SW changed from logical "0" to logical "1". In this case, (15−N1) =8 is set in the counter A, and N2 =30 is set in the counter B. At the same time, the frequency division factor of the prescaler 101 is changed from "16" to "15" and the prescaler 101 starts to frequency-divide the input signal fin at "15". The output signal fout is inverted in logical level by the inverter 42, and is applied to the input terminal $\overline{CP0}$ of the flip-flop $41_0$ of the least significant bit in the counter A, and to the input terminal $\overline{CP4}$ of the flip-flop $41_4$ of the least significant bit in the counter B. In the counter A, "15−N1" =8 has been programmed, and in the counter B, N2 =30 has been preset. Both the counters A and B count down the output signal fout or CPin of the prescaler 101. Since N1 is smaller than N2, the counter A completes the frequency dividing operation at "15−N1" earlier than the counter B. Upon completion of the frequency dividing operation, the counter A produces an output signal Pout of logical "1". The output signal Pout is input to the flip-flop 2 to invert its logical state. The result is the level inversion of the select signal SW from logical "1" to logical "0". Then, the frequency division factor of the prescaler 101 is switched from "15" to "16", so that the frequency of the output signal fout from the prescaler 101 becomes fin/16. Subsequently, the counter B counts down the output signal fout at fin/16. Since the counter B has completed the frequency division at "15−N1" at the instant that the prescaler 101 was set at "15", the counter B starts the frequency dividing operation at "N2−(15−N1)" from this point. Upon completion of this frequency division, the output signal Preset is logical "1". The output signal of logical "1" is input to the preset terminals Pr of the flip-flops $41_0$ to $41_9$ and also to the flip-flop 2. As a result, the programming data "15−N1" and "N2" are programmed again in the counters A and B, while at the same time the output signal SW of the flip-flop 2 is inverted to be logical "1". The frequency division factor of the prescaler 101 is returned to the initial value, "15". Subsequently, an operation similar to the above is repeated.

Figure 9:
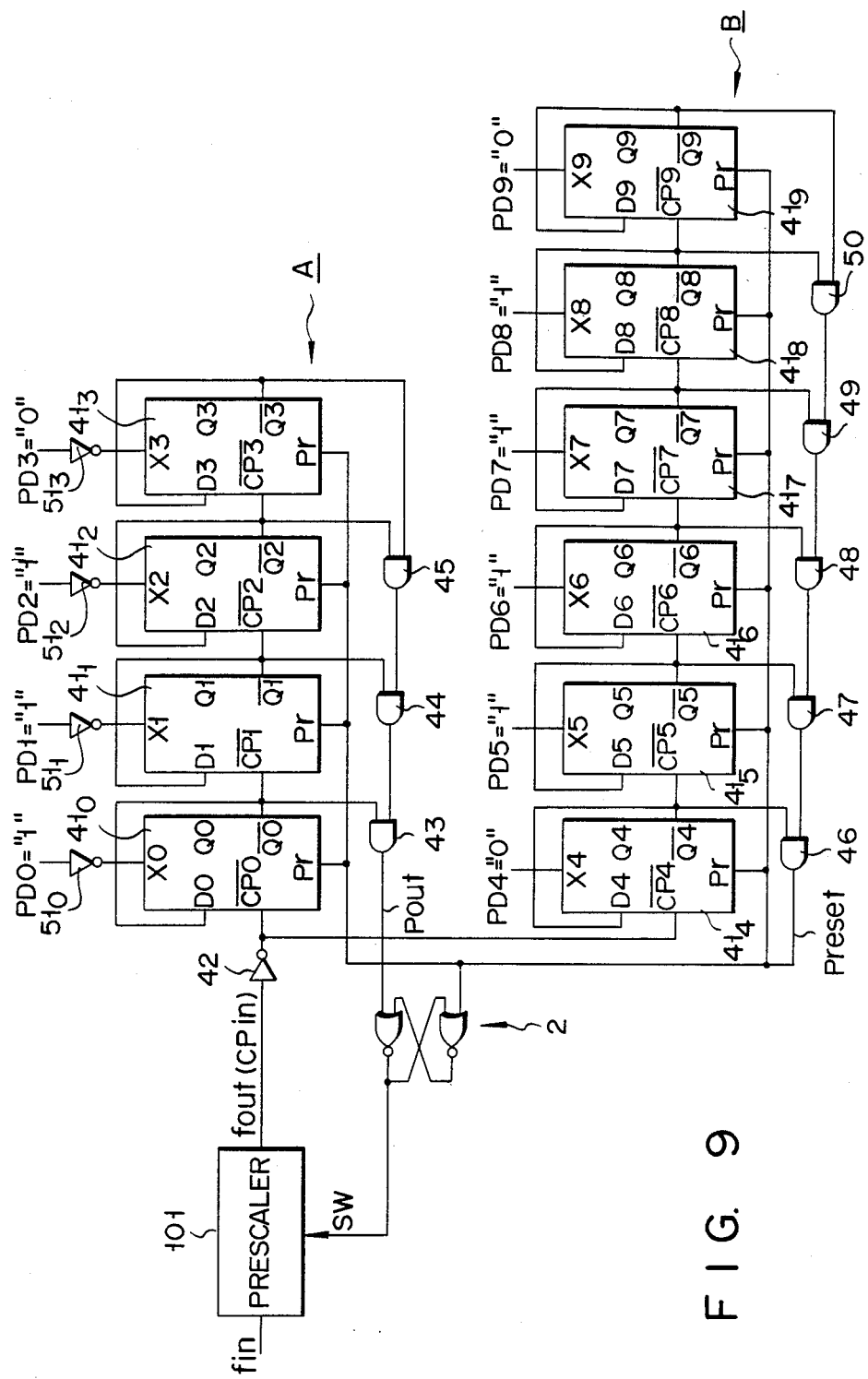
FIG. 9 shows a circuit diagram of an embodiment of a programmable counter system according to the present invention.
Figure 10:
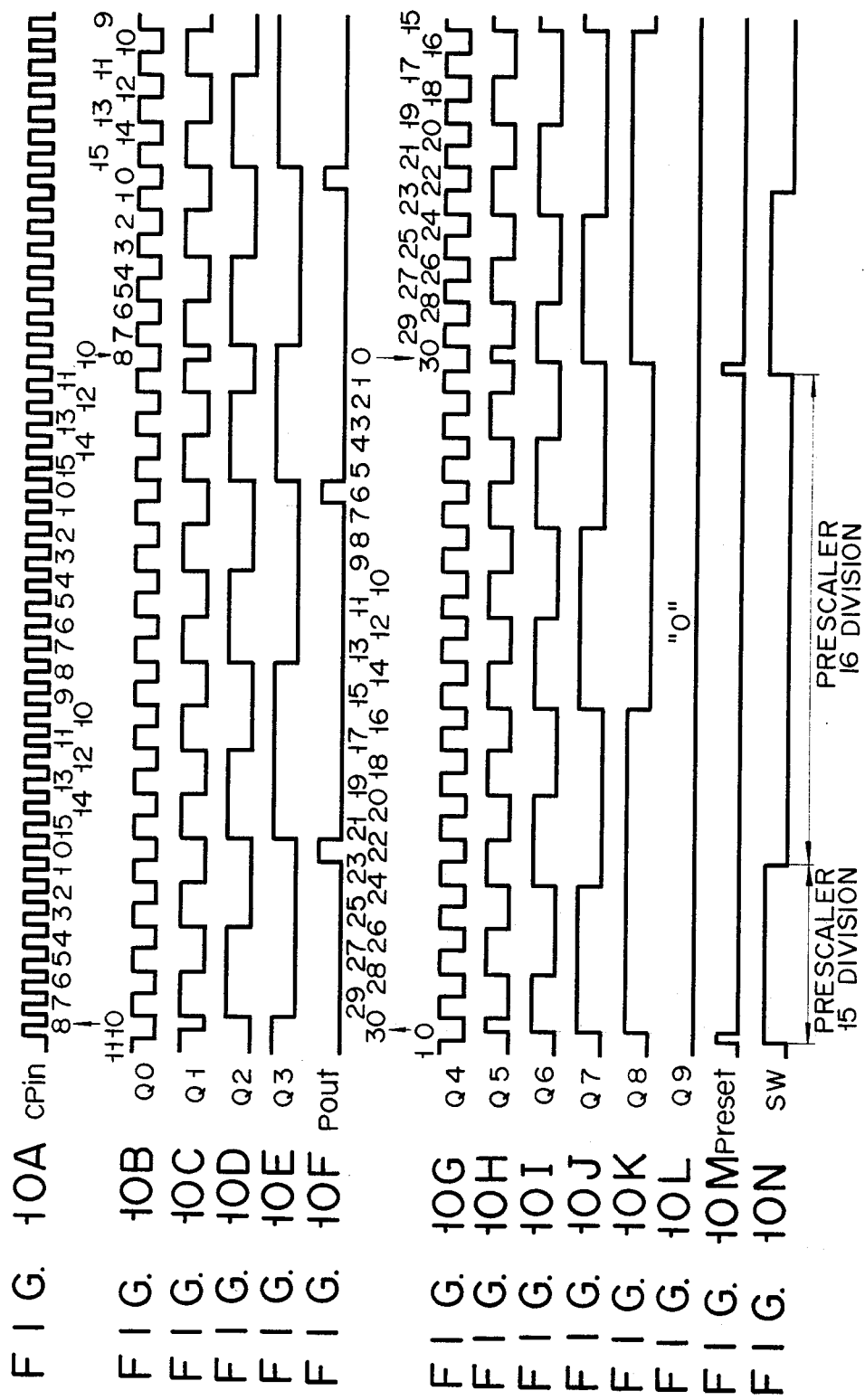
FIGS. 10A to 10N are timing charts of signals at various portions of the programmable counter system of FIG. 9.

As seen from FIGS. 10A to 10N, a division number of N of the counter system of FIG. 9 is $$N = 15 \times 8 + 16 \times 22$$
$$= 472$$

This value is "15" smaller than that (N =487) calculated when N1 =7 and N2 =30. Some compensating measure must be taken to eliminate this difference. A PLL (phase locked loop), for example, may be employed for this purpose, in which the compensation is performed together with the intermediate frequency compensating operation.

In the embodiment of FIG. 9, with the provision of the inverters $51_0$ to $51_3$, a complement of the programming signal may be set in the counter A. Because of this feature, it is possible to use a prescaler having a frequency division factor selectable from "$2^n-1$" and "$2^n$", and hence, the number of bits in the prescaler 101 is equal to that of the counter A. In this respect, the power dissipation and the operation speed of the programmable counter system are remarkably improved.

Figure 11:
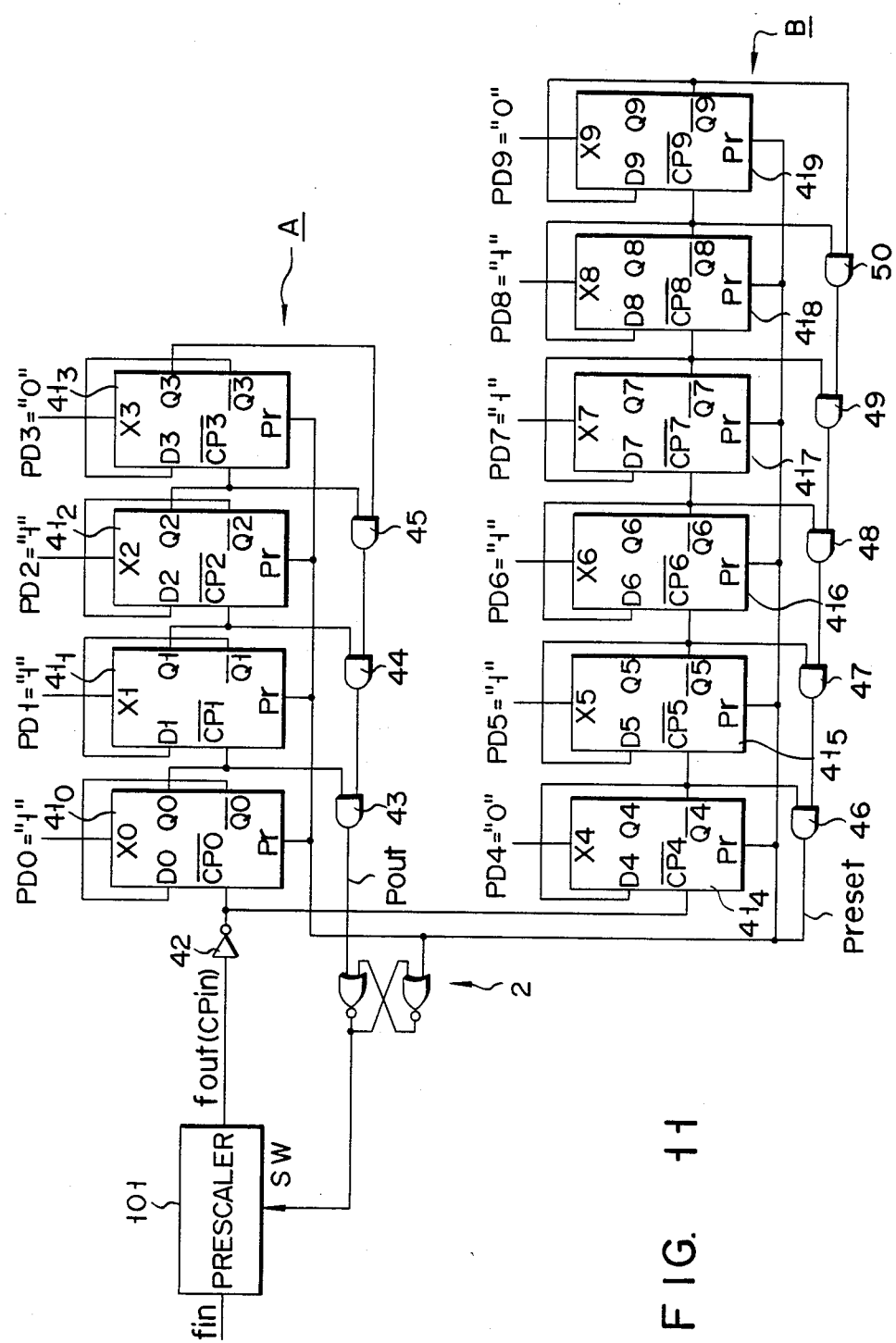
FIG. 11 shows a circuit diagram of another embodiment of a programmable counter system according to the present invention.

Turning now to FIG. 11, another embodiment of a programmable counter system according to the present invention is illustrated. In this embodiment, the inverters $51_0$ to $51_3$ in FIG. 9 are omitted. Further, an interconnection of the flip-flops $41_0$ to $41_3$ of the counter A is different from that of the FIG. 9 embodiment. The remaining portion of the arrangement of this embodiment is substantially equal to that of the embodiment in FIG. 9. Therefore, in the interest of simplicity like reference symbols are used for designating like or equivalent portions without further description. In the present embodiment, the programming signals PD0 to PD3 are directly applied to the flip-flops $41_0$ to $41_3$ without logical level inversion thereof. Further, the counter A is used as an up counter. To this end, the input terminals $\overline{CP1}$ to $\overline{CP3}$ of the flip-flops $41_1$ to $41_3$ are respectively connected to the output terminals $Q_0$ to $Q_2$, as shown. The output terminals $Q_3$ of the flip-flop $41_3$ is connected to an AND gate 45.

With this arrangement, when N1 =7 is set in the counter A, this counter performs the frequency division of "15−N1 (=7)" =8, as in the case of the FIG. 9 embodiment. Thus, the division number N of this programmable counter system is equal to that of the FIG. 9 embodiment.

Figure 12:
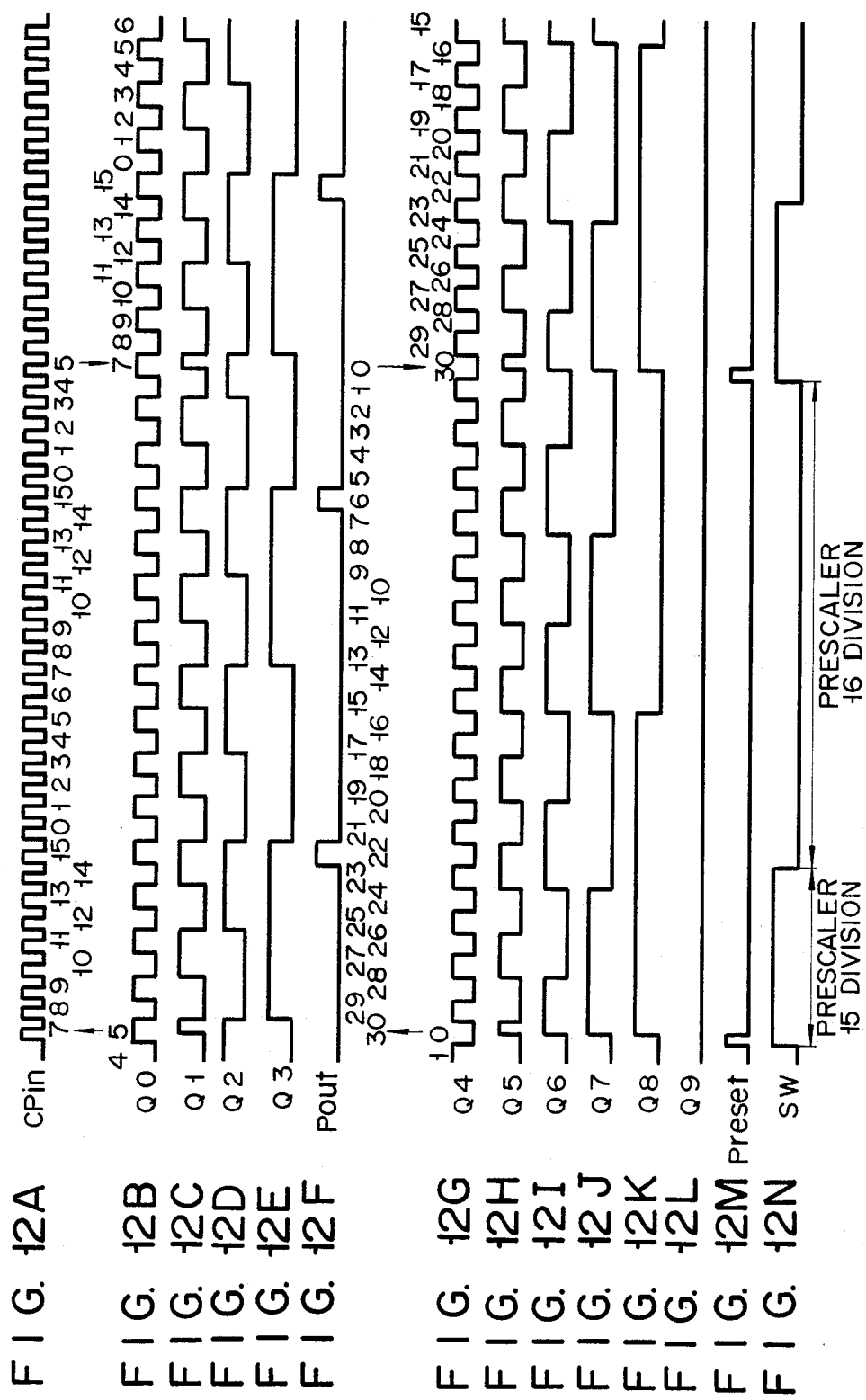
FIGS. 12A to 12N show a set of waveforms of signals at the various portions in the circuit of FIG. 11.

FIGS. 12A to 12N show timing charts explaining the operation of the FIG. 11 embodiment. FIG. 12A shows a waveform of an output signal fout or CPin of the prescaler 101. FIGS. 12B to 12E show waveforms of the output signals Q0 to Q3 of the flip-flops $41_0$ to $41_3$, respectively. FIG. 12F illustrates a waveform of an output signal Pout of the counter A. FIGS. 12G to 12L show waveforms of the output signals Q4 to Q9 of the flip-flops $41_4$ to $41_9$, respectively. FIG. 12M illustrates a waveform of an output signal or a preset signal Preset from the counter B. FIG. 12N shows a waveform of a frequency division factor select signal SW.

As seen from FIGS. 12A to 12N, a division number of the counter system of FIG. 11 is $$N = 15 \times 8 + 16 \times 22$$
$$= 472$$

This value of N is equal to that of the FIG. 9 embodiment.

In this embodiment, the programming signals PD0 to PD3 are directly applied to the counter A. Further, in the group of flip-flops $41_0$ to $41_3$, the output terminals Q of the preceding stage of the flip-flops are connected to the input terminals $\overline{CP}$ of the succeeding stage of the flip-flops, respectively. In such an arrangement of this embodiment, the counter A is operated as an up counter. This feature allows the use of the prescaler 101 whose frequency division factor can be switched between "$2^n - 1$" and "$2^n$". In other words, the bit number of the prescaler 101 can be equal to that of the counter A.

Figure 13:
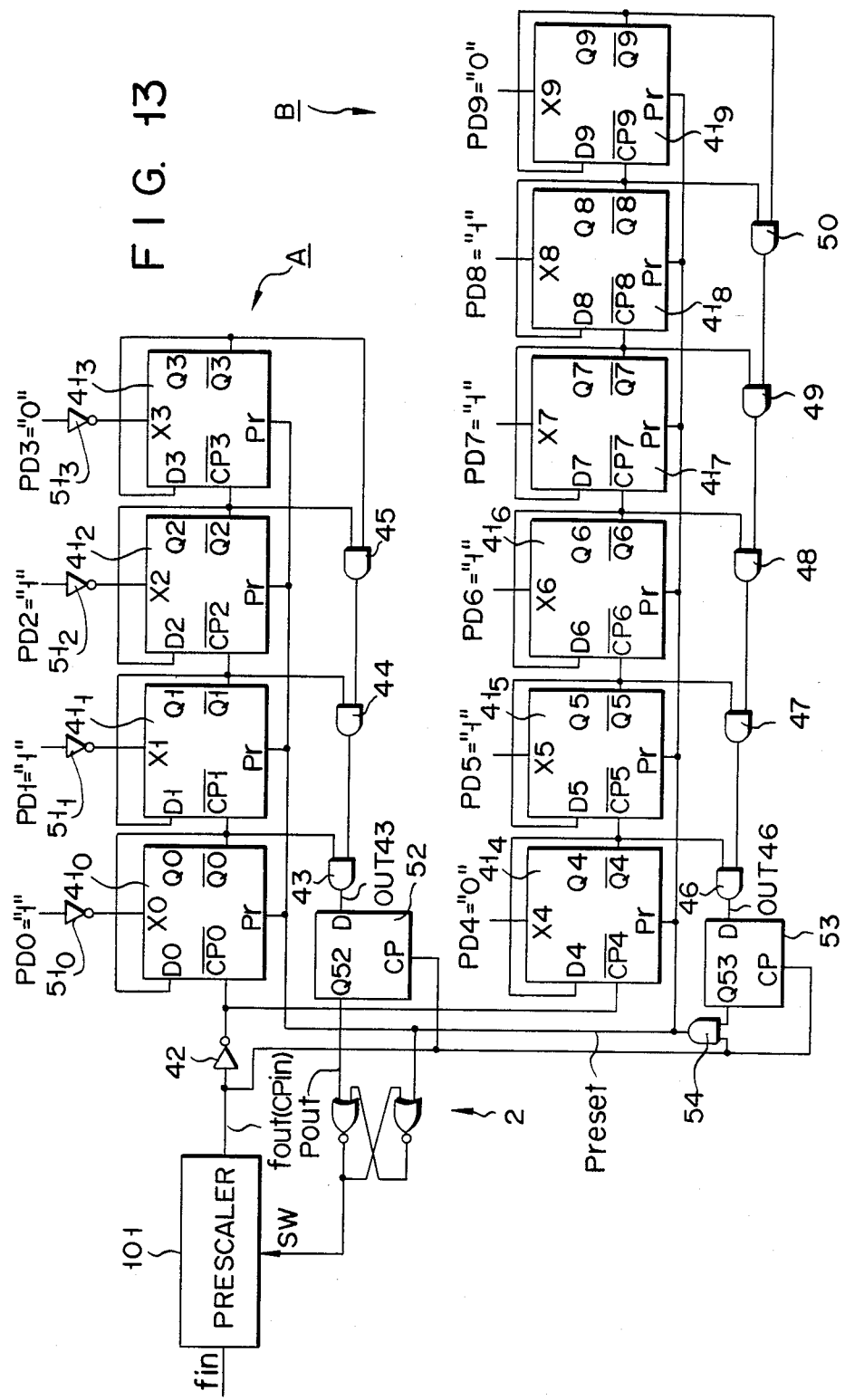
FIG. 13 shows a circuit diagram of another embodiment of a programmable counter system according to the present invention.

Reference is made to FIG. 13 illustrating still another embodiment of a programmable counter system according to the present invention. This embodiment corresponds to the FIG. 9 embodiment which additionally contains correction circuit for correcting a deviation of a division number "−15".

The correction circuit is composed of one-bit shift registers 52 and 53, and two-input type AND gate 54. The output terminal of the AND gate 43 of the counter A is connected to a D terminal of the shift register 52. The output terminal Q52 of the shift register 52 is connected to one of the input terminals of a flip-flop forming the control circuit 2. The output terminal of the AND gate 46 of the counter B is connected to the D terminal of the shift register 53. The output terminal Q53 of the shift register 53 is connected to one of the input terminals of the AND gate 53. An input signal CPin is input to the input terminals of the shift registers 52 and 53, and further to the other input terminal of the AND gate 54. The output terminal of the AND gate 54 is connected to the other input terminal of the control circuit, and to the preset terminals Pr of the flip-flops $41_0$ to $41_3$ in the counter A and the preset terminals Pr of the flip-flops $41_4$ to $41_9$ in the counter B.

In this embodiment, OUT43 and OUT46 designate the output signal Pout of the AND gate 43 and the output signal P$_{reset}$ of the AND gate 46 in FIG. 9, respectively. The signal from the output terminal Q52 of the shift register 52 is denoted as Pout and the output signal from the shift register 53 as P$_{reset}$.

Figure 14:
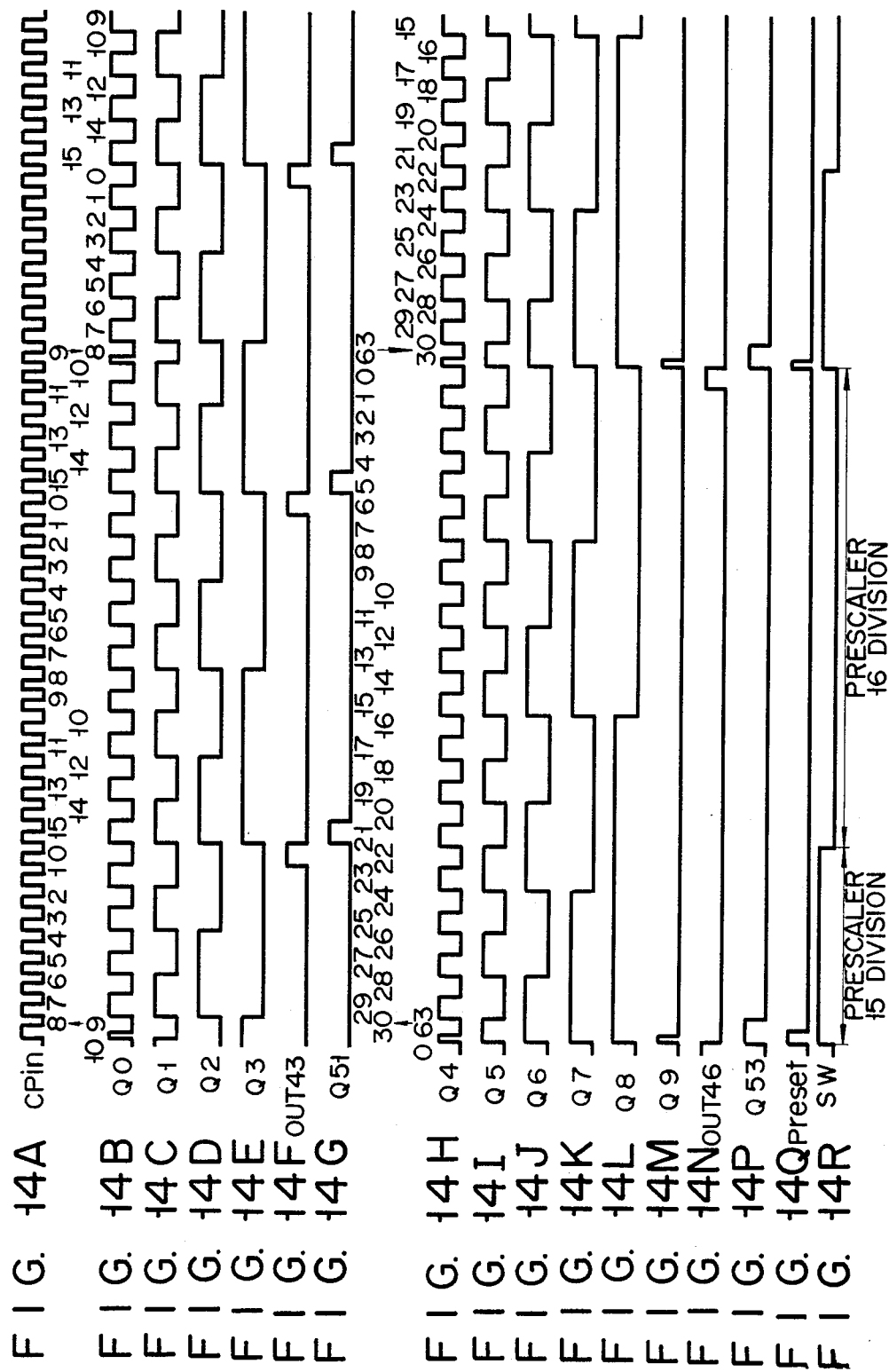
FIGS. 14A to 14R are signal time charts of signals at various portions in the circuit shown in FIG. 13, the character 140 not being used in order to avoid confusion with 140.

FIGS. 14A to 14R show timing charts of signals at the various portions when N1 = 7 and N2 = 30 in the present embodiment. The character 140 is not used in order to avoid confusion with the number 140.

FIG. 14A is a waveform of the output signal fout of the prescaler 101. FIGS. 14B to 14E are waveforms of the output signals $\overline{Q0}$ to $\overline{Q3}$ of the flip-flops $41_0$ to $41_3$, respectively. FIG. 14F shows a waveform of an output signal OUT43 of the AND gate 43. FIG. 14G shows a waveform of an output signal Q52 of the shift register 52. FIGS. 14H to 14M are waveforms of the output signals of the flip-flops $41_4$ to $41_9$ in the counter B, respectively. FIG. 14N shows an output signal OUT46 of the AND gate 46. FIG. 14P is a waveform of an output signal Q53 of the shift register 53. FIG. 14Q shows a waveform of an output signal from the AND gate 54. FIG. 14R shows a waveform of the output signal of the flip-flop 2.

As seen from the waveform diagrams just mentioned, the division number N of the programmable counter system of FIG. 13 is $$N = 15 \times 9 + 16 \times 22$$
$$= 487$$

This number is equal to the division number calculated using equation (2) when N1 = 7 and N2 = 30.

Turning now to FIG. 15, a detailed schematic diagram of the prescaler 101 used in FIGS. 9 to 13 is shown. As already described, the prescaler 101 selects a frequency division factor "15" or "16" according to a logical state "1" or "0" of the frequency division factor select signal SW.

As shown in FIG. 15, the prescaler 101 is composed of a three-input type NAND gate 55, a two-input type OR gate 56, a two-input type AND gate 57 and four flip-flops $58_0$ to $58_3$. A frequency division factor select signal SW is applied from the control circuit 2 to the first input terminal of the NAND gate 55. The second and third input terminals of the NAND gate 55 are respectively supplied with the output signal $\overline{Q3}$ of the flip-flop $58_3$ and the output $\overline{Q2}$ of the flip-flop $58_2$. The output terminal of the NAND gate 55 is connected to one of the input terminals of the OR gate 56. The other input terminal of the OR gate 56 is connected to the output terminal Q0 of the flip-flop $58_0$. The output terminal of the OR gate 56 is connected to one of the input terminals of the AND gate 57. The other input terminal of the AND gate 57 is connected to the output terminal Q1 of the flip-flop $58_1$. The output terminal of the AND gate 57 is connected to the D0 terminal of the flip-flop $58_0$. The output signal $\overline{Q0}$ of the flip-flop $58_0$ is connected to the D1 terminal of the flip-flop $58_1$. The output signal $\overline{Q1}$ of the flip-flop $58_2$ is connected to the input terminal CP of the flip-flop $58_2$ at the succeeding stage. The output signals $\overline{Q0}$ and $\overline{Q1}$ of the flip-flops $58_0$ and $58_1$ are respectively connected to the input terminals of the OR gate 56 and the AND gate 57, as mentioned above. The input signal fin is input to the input terminals CP of the flip-flop $58_0$ and $58_1$. The output Q2 of the flip-flop $58_2$ is connected to the third input terminal of the NAND gate 55, as mentioned above. The output Q2 of the flip-flop $58_2$ is connected to the D2 terminal thereof. The output signal Q2 of the flip-flop $58_2$ is connected to the input terminal CP of the flip-flop $58_3$. The output $\overline{Q3}$ of the flip-flop $58_3$ is connected to the second input terminal of the NAND gate 55, as mentioned above. The output terminal Q3 of the flip-flop $58_3$ is connected to the D3 terminal. The output signal fout of the prescaler 101 is derived from the output terminal $\overline{Q3}$ of the flip-flop $58_3$. FIGS. 16A to 16E, and 17A to 17E are respectively signal time charts of signals at various portions in the prescaler 101 when the select signal SW is logical "0" and "1", that is, its frequency division factor is set at "15" and "16". FIG. 16A is a waveform of the input signal fin. FIGS. 16B to 16E are waveforms of the output signals Q0 to Q3 of the flip-flops $58_0$ to $58_3$, respectively. Similarly, FIG. 17A shows a waveform of the input signal fin, and FIGS. 17B to 17E show waveforms of output signals of the flip-flops $58_0$ to $58_3$, respectively. As seen from FIGS. 16A to 16E, when the select signal is "1", the input frequency fin is frequency divided by the frequency division factor "15", through a decimal change of 1→14→12→13→11→10→8→9→7→6→4→5→3→2→0. When the select signal is logical "0", the input frequency fin is frequency divided by the frequency division factor of "16" through a decimal change of 1→15→14→12→13→11→10→8→9→7→6→4→5→3→2→0. In this way, the prescaler 101 switches the frequency division factor between "15" and "16" according to a logical state of the select signal SW.

In the embodiments of FIGS. 9, 11 and 13, after the prescaler 101 selects "16" as the frequency division factor, the counter B operates while the counter A does not. Therefore, at this time, the output signal fout may be prevented from being input to the counter A. Alternatively, the counter A may be in a preset state.

As described above, in a program counter system of the swallow operation type according to the present invention, the lower order bit counter is provided with means for setting a complement of a binary code of the programming signal. The provision of the complement setting means allows the use of the prescaler having a short bit width whose frequency division factor is selectable from "$2^n-1$" and "$2^n$". Therefore, the programmable counter system is considerably improved in terms of power dissipation and operation speed.

What is claimed is:

1. A programmable counter system comprising:
   a prescaler for frequency dividing an input signal by a selected one of frequency division factors "$2^n-1$" and "$2^n$";
   programmable counter means comprising first and second programmable counters connected to said prescaler, said first and second programmable counters receiving and counting an output signal of said prescaler and comprising an output terminal and preset terminals for receiving program data inputs;
   first division number means for supplying a plurality of binary bits as lower digit bits of program data,
   second division number means for supplying upper digit bits of program data;
   first setting means for supplying the complement of said lower digit bits of program data to said preset terminals of said first programmable counter as a division number;
   second setting means for supplying said upper digit bits of program data to said preset terminals of said second programmable counter as a division number; and
   selecting means connected to said programmable counter means for receiving output signals of said first and second programmable counters, and for selecting one of said frequency division factors "$2^n-1$" and "$2^n$" according to output signals of said first and second programmable counters.

2. A programmable counter system according to claim 1 wherein said first setting means comprises means for inverting the levels of said lower digit bits of program data and for applying said level inverted bits to said first programmable counter.

3. A programmable counter system according to claim 1 wherein said first setting means comprises means for applying said lower digit bits of program data to said first programmable counter and means for making said first programmable counter operate as a down counter.

4. A programmable counter system according to claim 1 further comprising means which corrects data counted by said programmable counter means.

5. A programmable counter system according to claim 1 wherein said prescaler commences opertion using the smaller of said frequency division factors.

6. A programmable counter system comprising:
   a prescaler for frequency dividing an input signal by a selected one of frequency division factors "$2^n-1$" and "$2^n$";
   programmable counter means comprising first and second programmable counters connected to said prescaler, said first and second programmable counters receiving and counting an output signal of said prescaler and comprising an output terminal and preset terminals for receiving program data inputs, one of said programmable counters being an up counter and the other of said programmable counters being a down counter;
   first division number means for supplying a plurality of binary bits as lower digit bits of program data,
   second division number means for supplying upper digit bits of program data;
   first setting means for supplying said lower digit bits of program data to said preset terminals of said first programmable counter as a division number;
   second setting means for supplying said upper digit bits of program data to said preset terminals of said second programmable counter as a division number; and
   selecting means connected to said programmable counter means for receiving output signals of signals of said first and second programmable counters, and for selecting one of said frequency division factors "$2^n-1$" and "$2^n$" according to output signals of said first and second programmable counters.

* * * * *